United States Patent
Lee et al.

(10) Patent No.: US 8,477,538 B2
(45) Date of Patent: Jul. 2, 2013

(54) FLASH MEMORY DEVICE AND A METHOD OF PROGRAMMING THE SAME

(75) Inventors: Jong-hoon Lee, Hwaseong-si (KR); Jun-yong Park, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 190 days.

(21) Appl. No.: 13/170,713

(22) Filed: Jun. 28, 2011

(65) Prior Publication Data

US 2012/0020167 A1 Jan. 26, 2012

(30) Foreign Application Priority Data

Jul. 23, 2010 (KR) .................. 10-2010-0071601

(51) Int. Cl.
*G11C 11/34* (2006.01)

(52) U.S. Cl.
USPC ............ 365/185.25; 365/189.05; 365/185.13; 365/185.26

(58) Field of Classification Search
USPC .............. 365/185.25, 189.05, 185.13, 185.26
See application file for complete search history.

(56) References Cited

U.S. PATENT DOCUMENTS

| 7,215,574 | B2 | 5/2007 | Khalid et al. | |
| 7,532,514 | B2 | 5/2009 | Cernea et al. | |
| 2002/0071311 | A1* | 6/2002 | Jeong et al. | ............. 365/185.12 |
| 2010/0091576 | A1* | 4/2010 | Kwon et al. | ............. 365/185.25 |

FOREIGN PATENT DOCUMENTS

KR 1020050108136 11/2005

* cited by examiner

*Primary Examiner* — Vu Le
*Assistant Examiner* — Han Yang
(74) *Attorney, Agent, or Firm* — F. Chau & Associates, LLC

(57) ABSTRACT

A flash memory device includes a memory cell array including a plurality of memory cells; a bit line voltage control signal generator generating and outputting a bit line voltage control signal; and a page buffer unit connected to the memory cell array through a plurality of bit lines, and controlling voltage levels of the plurality of bit lines in response to the bit line voltage control signal output from the bit line voltage control signal generator, wherein the plurality of bit lines comprise a first bit line and a second bit line adjacent to the first bit line, wherein during a bit line pre-charging operation in which the first bit line is in a program inhibited state and the second bit line is in a programming state, the page buffer unit increases a voltage level of the first bit line in response to the bit line voltage control signal, wherein the increase in the voltage level of the first bit line causes a voltage level of the second bit line to increase, and wherein a voltage level of the bit line voltage control signal is not affected by a change in a power voltage of the flash memory device.

22 Claims, 6 Drawing Sheets

FLASH MEMORY DEVICE AND A METHOD OF PROGRAMMING THE SAME

CROSS-REFERENCE TO RELATED APPLICATION

This application claims priority under 35 U.S.C. §119 to Korean Patent Application No. 10-2010-0071601, filed on Jul. 23, 2010, in the Korean Intellectual Property Office, the disclosure of which is incorporated by reference herein in its entirety.

BACKGROUND

1. Technical Field

The inventive concept relates to flash memory devices and methods of programming the same, and more particularly, to a flash memory device that compensates for a boosting charge effect (BCE) between memory cells without being affected by a change in a power voltage, and a programming method of the flash memory device.

2. Discussion of the Related Art

Flash memory is a device that maintains stored data without a power source. Flash memory is commonly used in portable electronics and removable storage devices, and to replace computer hard drives. Due to the scaling down of flash memory devices, gaps between the memory cells have shrunk, thereby increasing the impact of the BCE.

For example, in the case of adjacent memory cells on adjacent bit lines, where one cell (first cell) is to be programmed and the other cell (second cell) is not to be programmed, the BCE may cause the first cell to be over-programmed. This is so, because a voltage applied to the second cell to inhibit programming may be coupled to the first cell, and then, this extra voltage is added to a programming voltage applied to first cell. A conventional method of compensating for the BCE involves pre-setting the amount of coupling voltage applied to the first cell and reducing the program voltage by this amount. However, the pre-set amount varies when a power voltage supplied to the flash memory device is changed.

Accordingly, there is a need to reduce the effect of a change of a power voltage in a BCE compensation method.

SUMMARY

According to an exemplary embodiment of the inventive concept, there is provided a flash memory device including: a memory cell array comprising a plurality of memory cells; a bit line voltage control signal generator generating and outputting a bit line voltage control signal; and a page buffer unit connected to the memory cell array through a plurality of bit lines, and controlling voltage levels of the plurality of bit lines in response to the bit line voltage control signal output from the bit line voltage control signal generator, wherein the plurality of bit lines comprise a first bit line and a second bit line adjacent to the first bit line, wherein during a bit-line pre-charging operation in which the first bit line is in a program inhibited state and the second bit line is in a programming state, the page buffer unit increases a voltage level of the first bit line in response to the bit line voltage control signal, wherein the increase in the voltage level of the first bit line causes a voltage level of the second bit line to increase, and wherein a voltage level of the bit line voltage control signal is not affected by a change in a power voltage of the flash memory device.

The page buffer unit may include: a bit line voltage supplying unit outputting a plurality of bit line supplying voltages respectively corresponding to the plurality of bit lines; and a bit line voltage controller controlling the voltage levels of the plurality of bit lines in response to the bit line voltage control signal and the plurality of bit line supplying voltages.

The bit line voltage controller may include a plurality of transistors connected between the plurality of bit lines and the bit line voltage supplying unit, wherein first terminals of the plurality of transistors are connected to corresponding bit lines, second terminals of the plurality of transistors are supplied with corresponding bit line supplying voltages, and the bit line voltage control signal is applied to gate terminals of the plurality of transistors.

The voltage level of the bit line voltage control signal may be transited to a first voltage level, a second voltage level, and a third voltage level in the bit line pre-charging operation before a programming operation of the flash memory device.

The first voltage level may be greater than a level of the power voltage, and the first bit line and the second bit line may be pre-charged to the level of the power voltage while the voltage level of the bit line voltage control signal is maintained at the first voltage level.

The second voltage level may be lower than the first voltage level, and the first bit line may be maintained in the program inhibited state and the second bit line may be discharged to a ground voltage while the voltage level of the bit line voltage control signal is maintained at the second voltage level.

The voltage level of the first bit line may be reduced due to the second bit line being discharged to the ground voltage, while the voltage level of the bit line voltage control signal is maintained at the second voltage level.

The third voltage level may be greater than the second voltage level, and the bit line supplying voltage corresponding to the second bit line may be floated before the voltage level of the bit line voltage control signal is transited from the second voltage level to the third voltage level.

The voltage level of the second bit line may be increased due to the voltage level of the first bit line being increased, when the voltage level of the bit line voltage control signal is transited from the second voltage level to the third voltage level.

The first voltage level, the second voltage level, and the third voltage level may have constant voltage levels that are not affected by the change of the power voltage.

According to an exemplary embodiment of the inventive concept, there is provided a flash memory device including: a memory cell array comprising a plurality of memory cells; and a page buffer unit connected to the memory cell array through a plurality of bit lines, and controlling voltage levels of the plurality of bit lines in response to a bit line voltage control signal, wherein the plurality of bit lines comprise a first bit line and a second bit line adjacent to the first bit line, wherein during a bit line pre-charging operation in which the first bit line is in a program inhibited state and the second bit line is in a programming state, the page buffer unit increases a voltage level of the first bit line in response to the bit line voltage control signal, wherein the increase in the voltage level of the first bit line causes a voltage level of the second bit line to increase, and wherein a voltage level of the bit line voltage control signal is not affected by a change in a power voltage of the flash memory device.

The page buffer unit may include: a bit line voltage supplying unit outputting a plurality of bit line supplying voltages respectively corresponding to the plurality of bit lines; and a bit line voltage controller controlling the voltage levels of the plurality of bit lines in response to the bit line voltage control signal and the plurality of bit line supplying voltages.

The voltage level of the bit line voltage control signal may be transited to a first voltage level, a second voltage level, and a third voltage level in the bit line pre-charging operation before a programming operation of the flash memory device.

The first voltage level may be greater than a level of the power voltage, and the first bit line and the second bit line may be pre-charged to the level of the power voltage while the voltage level of the bit line voltage control signal is maintained at the first voltage level.

The second voltage level may be lower than the first voltage level, and the first bit line may be maintained in the program inhibited state and the second bit line may be discharged to a ground voltage while the voltage level of the bit line voltage control signal is maintained at the second voltage level.

The third voltage level may be greater than the second voltage level, and the bit line supplying voltage corresponding to the second bit line may be floated before the voltage level of the bit line voltage control signal is transited from the second voltage level to the third voltage level.

According to an exemplary embodiment of the inventive concept, there is provided a method of programming a flash memory device including: pre-charging a first bit line that is in a program inhibited state and a second bit line that is in a programming state and adjacent to the first bit line; reducing a voltage level of the second bit line to a first voltage; increasing a voltage level of the first bit line to a second voltage after reducing the voltage level of the second bit line to the first voltage, and increasing the voltage level of the second bit line due to the increase of the voltage level of the first bit line to the second voltage; and programming a memory cell corresponding to the second bit line, wherein the second voltage is not affected by a change in a power voltage of the flash memory device.

When the voltage level of the second bit line is reduced to the first voltage, this may cause the voltage level of the first bit line to be reduced.

The voltage level of the first bit line, which is reduced when the voltage level of the second bit line is reduced to the first voltage, may not be affected by the change in the power voltage and may maintain the first bit line in the program inhibited state.

A bit line supplying voltage corresponding to the second bit line may be floated before increasing the voltage level of the first bit line to the second voltage.

According to an exemplary embodiment of the inventive concept, there is provided a non-volatile memory device including: a unit connected to a plurality of memory cells via a plurality of bit lines, wherein the unit controls voltage levels of the plurality of bit lines in response to a first signal, wherein the plurality of bit lines comprise a first bit line and a second bit line adjacent to the first bit line, and when the first bit line is in a program inhibited state and the second bit line is in a programming state, the unit increases a voltage of the first bit line by a first amount in response to the first signal, wherein the increase of the voltage of the first bit line by the first amount causes a voltage of the second bit line to be increased by a second amount, and when a power voltage of the non-volatile memory device transitions from a first level to a second level, the first amount does not change.

A memory cell connected to the second bit line may be programmed with a programming voltage reduced by about the second amount.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Exemplary embodiments of the inventive concept will be described more fully hereinafter with reference to the accompanying drawings. This inventive concept may, however, be embodied in many different forms and should not be construed as limited to the embodiments set forth herein.

It will be understood that when an element or layer is referred to as being "connected" to another element or layer, the element or layer can be directly connected to the another element or layer or intervening elements or layers may be present.

Figure 1:
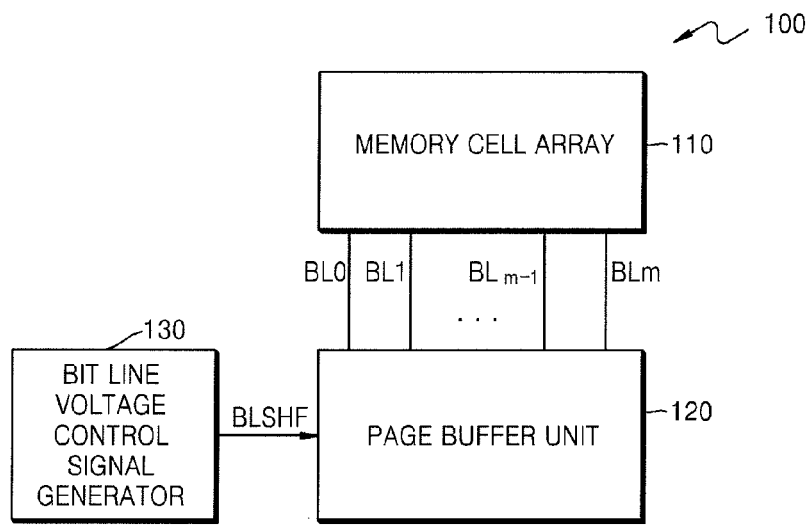
FIG. 1 is a block diagram of a flash memory device according to an exemplary embodiment of the present inventive concept.

FIG. 1 is a block diagram of a flash memory device 100 according to an exemplary embodiment of the present inventive concept. Referring to FIG. 1, the flash memory device 100 may include a memory cell array 110, a page buffer unit 120, and a bit line voltage control signal generator 130.

The memory cell array 110 shown in FIG. 1 is a general flash memory cell array including a plurality of memory cells. Since the structure and operations of the memory cell array 110 are known to one of ordinary skill in the art, detailed descriptions of the memory cell array 110 are not provided here. The memory cell array 110 of FIG. 1 may be a NAND flash memory cell array.

The page buffer unit 120 may be connected to the memory cell array 110 through a plurality of bit lines BL0, BL1, ..., BLm-1, and BLm. The page buffer unit 120 may control voltage levels of the plurality of bit lines BL0, BL1, ..., BLm-1, and BLm in response to a bit line voltage control signal BLSHF input from the bit line voltage control signal generator 130. Although not shown in FIG. 1, the page buffer unit 120 includes a latch unit (not shown) and a data input/output unit (not shown) to read data stored in the memory cell array 110 or write the data to the memory cell array 110.

The bit line voltage control signal generator 130 may generate the bit line voltage control signal BLSHF and output the generated signal to the page buffer unit 120. The bit line voltage control signal BLSHF may have a voltage level that is unaffected by a change in a power voltage supplied to the flash memory device 100 from the outside, since the bit line voltage control signal BLSHF is generated independent of the power voltage. For example, the bit line voltage control signal generator 130 may receive voltages of constant magnitudes output from an internal voltage generator (not shown) included in the flash memory device 100. The bit line voltage control signal generator 130 may determine the voltage level of the bit line voltage control signal BLSHF according to the voltages of constant magnitudes supplied from the internal voltage generator (not shown) and outputs the bit line voltage control signal BLSHF. On the other hand, a flash memory device according to an exemplary embodiment of the present inventive concept may not include the bit line voltage control signal generator 130; in this case the bit line control signal BLSHF may be generated by the internal voltage generator, or by an external bit line voltage control signal generator.

Before describing operations of the flash memory device 100 according to the present embodiment, a boosting charge effect (BCE) of a flash memory device will be described as follows. The BCE is a phenomenon which may occur between adjacent strings of memory cells. For example, when an adjacent string in a programming inhibited state is boosted to a high voltage during an incremental step pulse program (ISPP) of the flash memory device, a floating gate voltage of the memory cell that will be programmed is increased due to a coupling effect between the strings, thereby causing the memory cell to be over-programmed with more than the ISPP voltage.

In other words, during the ISPP, a memory cell is programmed to have a floating gate voltage greater than a verify voltage, and then, the memory cell enters the program inhibited state in a next loop. Then, the string including the memory cell that is in the program inhibited state is boosted to the high voltage, and thus, the floating gate voltage of the memory cell, which is to be programmed and adjacent to the memory cell in the program inhibited state, is increased due to the coupling effect. Then, the memory cell that should be programmed by just the ISPP is programmed to have a higher voltage than the ISPP voltage because there exists the extra floating gate voltage due to the coupling effect. Thus, due to the BCE, the distribution of the voltage levels of the memory cells is scattered. Further, the effects of the BCE increase as flash memory devices scale down.

In general, to compensate for the effects of the BCE, a bit line voltage is controlled using a voltage value that is related to a power voltage VDD. In other words, conventionally, in a bit-line pre-charge step before the programming, the bit lines connected to the memory cells not to be programmed (referred to as "the bit lines in the program inhibited state") are pre-charged to a voltage of VDD−A, and then, the bit lines connected to the memory cells to be programmed (referred to as "the bit lines to be programmed") are pre-charged to 0V. In other words, according to the conventional method, the bit lines in the program inhibited state and the bit lines to be programmed are pre-charged to different voltage values. Next, the bit lines to be programmed are floated, and voltages of the bit lines in the program inhibited state are increased by as much as A with respect to the voltage of VDD, and then, the voltage levels of the bit lines adjacent to the bit lines in the program inhibited states among the bit lines to be programmed are increased by as much as αA due to the coupling effect. Here, α denotes a coupling ratio between the bit lines, and may have a value of about 80% to about 90%.

Accordingly, the voltage of the bit lines adjacent to the bit lines in the program inhibited state among the bit lines to be programmed is αA, not 0V. Accordingly, the bit lines to be programmed are programmed with a program voltage minus as much as αA in the next programming operation. Thus, the over-programming of the memory cells adjacent to the bit lines in the program inhibited states with more than the ISPP voltage may be compensated for.

On the other hand, among the bit lines to be programmed, the bit lines that are not adjacent to the bit lines in the program inhibited state are not affected by the coupling effect, and the pre-charge voltage of 0V is maintained, and these bit lines may be programmed with just the ISPP voltage.

However, in the conventional method, to control the voltages of the bit lines in the program inhibited state, voltages such as VDD+Vt and VDD+Vt−A are used. This is done, for example, to set the amount of voltage by which the bit line to be programmed is increased due to the coupling effect. Here, Vt may be a threshold voltage of a transistor connected to the bit line.

The voltages such as VDD+Vt and VDD+Vt−A may be used when the power voltage VDD is constant and in a device using a constant power voltage VDD provided from an internal voltage converter (IVC); however, in a device in which the power voltage VDD frequently changes, an extra circuit for generating the voltages VDD+Vt and VDD+Vt−A is typically required.

Now, instead of using the circuit for generating the voltages VDD+Vt and VDD+Vt−A, constant voltage values may be used as the voltages VDD+Vt and VDD+Vt−A under the assumption that values of VDD and Vt are constant. However, in this case, the amount of voltage, which is increased by the coupling effect between the bit lines, varies depending on the power voltage VDD and the voltage Vt, and thus, the distribution of the voltage levels of the memory cells is affected by a change of the power voltage VDD.

According to the flash memory device 100 of the present embodiment, voltages of the plurality of bit lines BL0, BL1, ..., BLm−1, and BLm are controlled using a voltage that is unaffected by a change of the power voltage VDD, and thus, the BCE may be compensated for constantly. In other words, the bit line voltage control signal BLSHF output from the bit line voltage control signal generator 130 may have a voltage level that is not impacted by a change of the power voltage VDD that is supplied to the flash memory device 100.

Detailed operations of the flash memory device 100 according to the present embodiment will be described as follows with reference to FIG. 1.

Due to a difference between characteristics of the memory cells included in the memory cell array 110, some of the plurality of bit lines BL0, BL1, ..., BLm−1, and BLm may be in the program inhibited state while other bit lines may be in the programming state during a programming operation of the flash memory device 100. Therefore, among the plurality of bit lines BL0, BL1, ..., BLm−1, and BLm, under an assumption that the first bit line BL0 may be in the program inhibited state and the second bit line BL1 adjacent to the first bit line BL0 is in the programming state, a bit line pre-charge operation performed before the programming operation of the flash memory device 100 will be described in detail. Here, the adjacent bit lines may refer to a state where the bit lines are neighboring and may be affected by the coupling effect between each other.

First, the page buffer unit 120 may pre-charge the first bit line BL0 that is in the program inhibited state and the second bit line BL1 that is in the programming state and adjacent to the first bit line BL0 to a predetermined voltage in response to the bit line voltage control signal BLSHF. As an example, the bit line voltage control signal BLSHF may have a higher voltage level than the power voltage VDD, and the first bit line BL0 and the second bit line BL1 may be pre-charged to the level of the power voltage VDD. The voltage level of the bit line voltage control signal BLSHF and the voltage level to which the first and second bit lines BL0 and BL1 are pre-charged are not limited to the above example, and may be modified variously by one of ordinary skill in the art.

Next, the bit line voltage control signal generator 130 reduces the voltage level of the bit line voltage control signal BLSHF and outputs the bit line voltage control signal BLSHF to the page buffer unit 120. The page buffer unit 120 may reduce the voltage level of the second bit line BL1 in the programming state to a ground voltage level. Here, when the voltage level of the second bit line BL1 is reduced to the ground voltage level, the voltage level of the first bit line BL0 is also reduced due to the coupling effect caused by the reduction of the voltage level of the second bit line BL1. The voltage level of the first bit line BL0 may be reduced to a level that is less than the voltage level of the just reduced bit line voltage control signal BLSHF. However, even when the voltage level of the first bit line BL0 is reduced this way, the first bit line BL0 is maintained in the program inhibited state.

Next, the page buffer unit 120 floats the second bit line BL1, and the bit line voltage control signal generator 130 increases the voltage level of the bit line voltage control signal BLSHF by as much as A and outputs the bit line voltage control signal BLSHF to the page buffer unit 120. According to this increase of the voltage level of the bit line voltage control signal BLSHF, the voltage level of the first bit line BL0 may be increased by as much as A. Therefore, the voltage level of the second bit line BL1 is increased by as much as αA due to the coupling effect caused by the increase of the voltage level of the first bit line BL0. As described above, α denotes a coupling ratio between the bit lines, and may have a value of about 80% to about 90%.

According to the above operations, in the flash memory device 100 of the present embodiment, the first bit line BL0 in the program inhibited state is pre-charged from the power voltage VDD to a voltage level that is lower than the power voltage VDD and is maintained in the program inhibited state, and the second bit line BL1 that is adjacent to the first bit line BL0 is pre-charged from 0V to the voltage level of about αA, and the first and second bit lines BL0 and BL1 are kept in these states after the bit line pre-charge operation is finished.

Therefore, in the programming operation after the bit line pre-charge operation, the memory cell corresponding to the second bit line BL1 is programmed with a voltage reduced by as much as αA. Thus, the memory cell that is adjacent to the bit line in the program inhibited state is not over-programmed to have a voltage higher than the ISPP voltage. Here, the value of A may vary depending on the voltage level to be compensated for according to the BCE and the coupling ratio α, and may be selected by a user.

During the operation of the flash memory device 100 of the present embodiment, the voltage level of the bit line voltage control signal BLSHF output from the bit line voltage control signal generator 130 may be unaffected by a change of the power voltage VDD that is supplied to the flash memory device 100. Therefore, the flash memory device 100 of the present embodiment does not require an additional circuit for generating a voltage of VDD+Vt that is dependent upon the power voltage VDD, and pre-charges the second bit line BL1 to the constant voltage level αA without being impacted by a change of the power voltage VDD. Thus, the over-programming of the memory cell to have a floating gate voltage higher than the ISPP voltage may be constantly compensated for.

Operations of the flash memory device 100 according to the present embodiment will be described in more detail with reference to FIG. 4.

Figure 2:
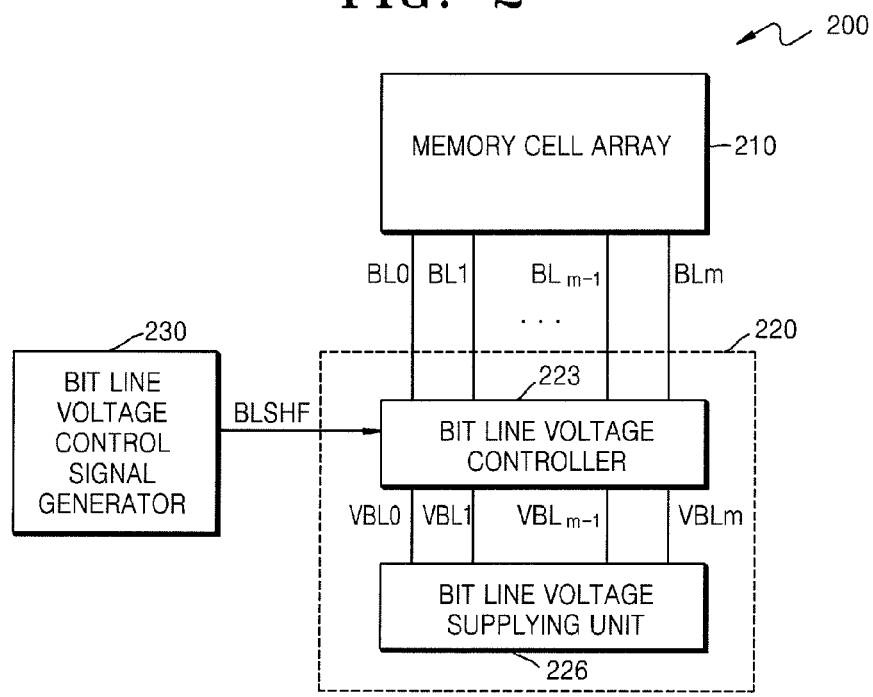
FIG. 2 is a block diagram of a flash memory device according to an exemplary embodiment of the present inventive concept.

FIG. 2 is a detailed block diagram of a flash memory device 200 according to an exemplary embodiment of the present inventive concept. Referring to FIG. 2, the flash memory device 200 includes a memory cell array 210, a page buffer unit 220, and a bit line voltage control signal generator 230. The memory cell array 210 and the bit line voltage control signal generator 230 shown in FIG. 2 may correspond to the memory cell array 110 and the bit line voltage control signal generator 130 shown in FIG. 1.

Referring to FIG. 2, the page buffer unit 220 may include a bit line voltage controller 223 and a bit line voltage supplying unit 226. The bit line voltage controller 223 may control voltage levels of a plurality of bit lines BL0, BL1, ..., BLm−1, and BLm in response to the bit line voltage control signal BLSHF input from the bit line voltage control signal generator 230 and a plurality of bit line supplying voltages VBL0, VBL1, ..., VBLm−1, and VBLm input from the bit line voltage supplying unit 226. The bit line voltage supplying unit 226 may output the plurality of bit line supplying voltages VBL0, VBL1, ..., VBLm−1, and VBLm that respectively correspond to the plurality of bit lines BL0, BL1, ..., BLm−1, and BLm to the bit line voltage controller 223. Operations of the bit line voltage controller 223 and the bit line voltage supplying unit 226 will be described in detail with reference to FIGS. 3 and 4.

Figure 3:
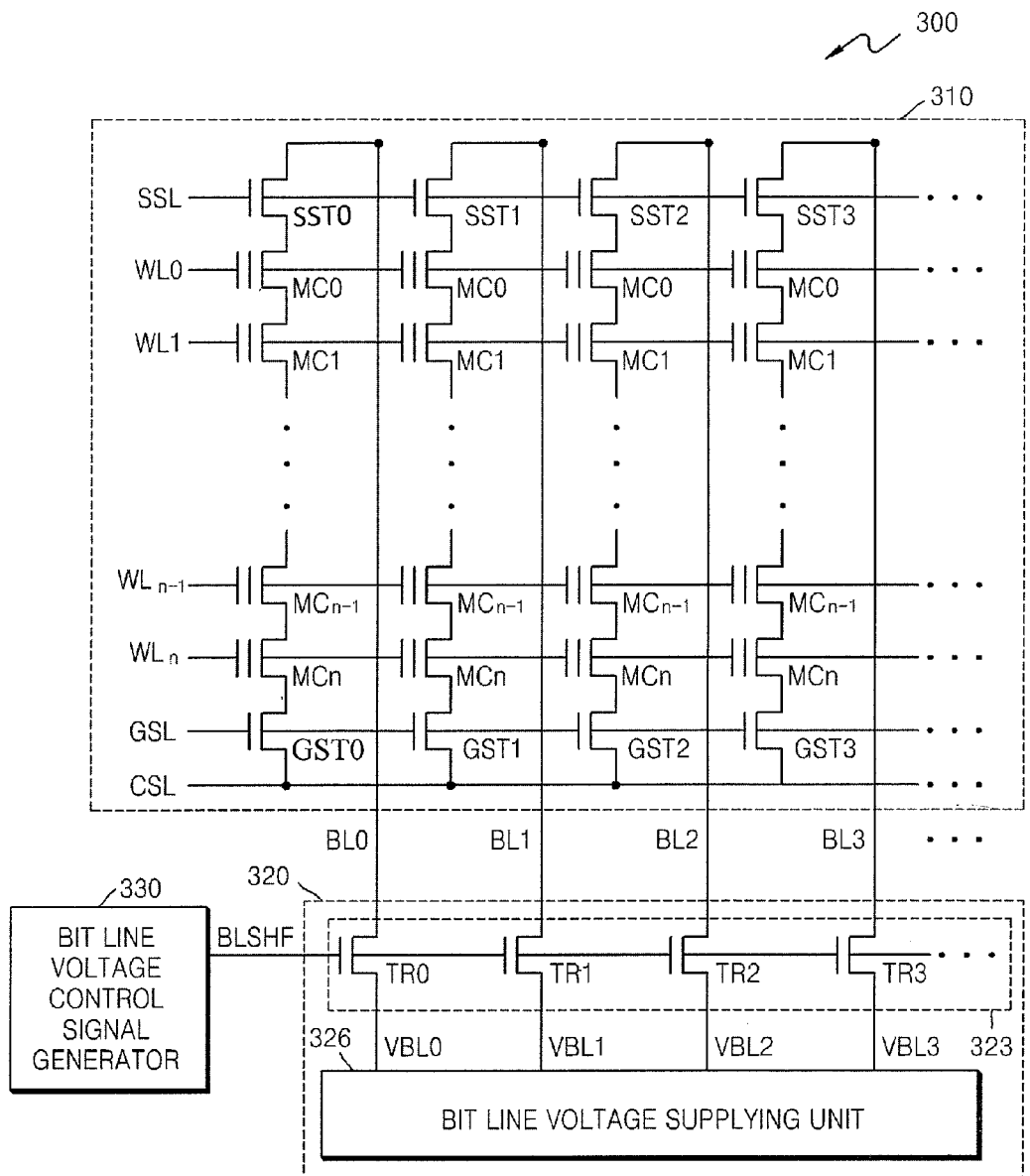
FIG. 3 is a block diagram showing a flash memory device according to an exemplary embodiment of the present inventive concept.

FIG. 3 is a diagram showing a flash memory device 300 according to an exemplary embodiment of the present inventive concept. Referring to FIG. 3, the flash memory device 300 includes a memory cell array 310, a page buffer unit 320, and a bit line voltage control signal generator 330. The page buffer unit 320 may include a bit line voltage controller 323 and a bit line voltage supplying unit 326. The memory cell array 310 and the bit line voltage control signal generator 330 shown in FIG. 3 may respectively correspond to the memory cell array 110 and the bit line voltage control signal generator 130 illustrated in FIG. 1. In addition, the bit line voltage controller 323 and the bit line voltage supplying unit 326 of FIG. 3 may respectively correspond to the bit line voltage controller 223 and the bit line voltage supplying unit 226 illustrated in FIG. 2.

The memory cell array 310 included in the flash memory device 300 of FIG. 3 may be a NAND flash memory cell array. Referring to FIG. 3, the memory cell array 310 may include strings each including a string selection transistor (SST), a plurality of memory cells MC0, ..., MCn, and a ground selection transistor (GST). The plurality of memory cells MC0, ..., MCn may be connected between the SST and the GST, and a control gate of each of the plurality of memory cells MC0, ..., MCn may be connected to a corresponding word line WL0, ..., or WLn.

A drain of the SST may be connected to the corresponding bit line BL0, ..., or BL3, and a gate of the SST may be connected to a string selection line (SSL). In addition, a source of the GST may be connected to a common source line (CSL), and a gate of the GST may be connected to a ground selection line (GSL). One SST, one GST, and the plurality of memory cells MC0, ..., MCn connected between the SST and the GST may be referred to as a string. Since the structure and operations of the memory cell array 310 shown in FIG. 3 are known to one of ordinary skill in the art, detailed descriptions thereof are not provided here.

The bit line voltage controller 323 may include a plurality of transistors TR0, TR1, TR2, and TR3 that are controlled by the bit line voltage control signal BLSHF. In other words, the bit line voltage control signal BLSHF output from the bit line voltage control signal generator 330 may be applied to a gate terminal of each of the plurality of transistors TR0, TR1, TR2, and TR3. In addition, a first terminal of each of the plurality of transistors TR0, TR1, TR2, and TR3 may be connected to the corresponding bit line BL0, BL1, BL2, or BL3, and a second terminal of each of the plurality of transistors TR0, TR1, TR2, and TR3 may be connected to the bit line voltage supplying unit 326.

The bit line voltage controller 323 may control the voltages of the bit lines BL0, BL1, BL2, and BL3 according to the bit line voltage control signal BLSHF and corresponding bit line supplying voltages VBL0, VBL1, VBL2, and VBL3. Detailed operations of the bit line voltage controller 323 and the bit line voltage supplying unit 326 will be described with reference to FIG. 4.

Figure 4:
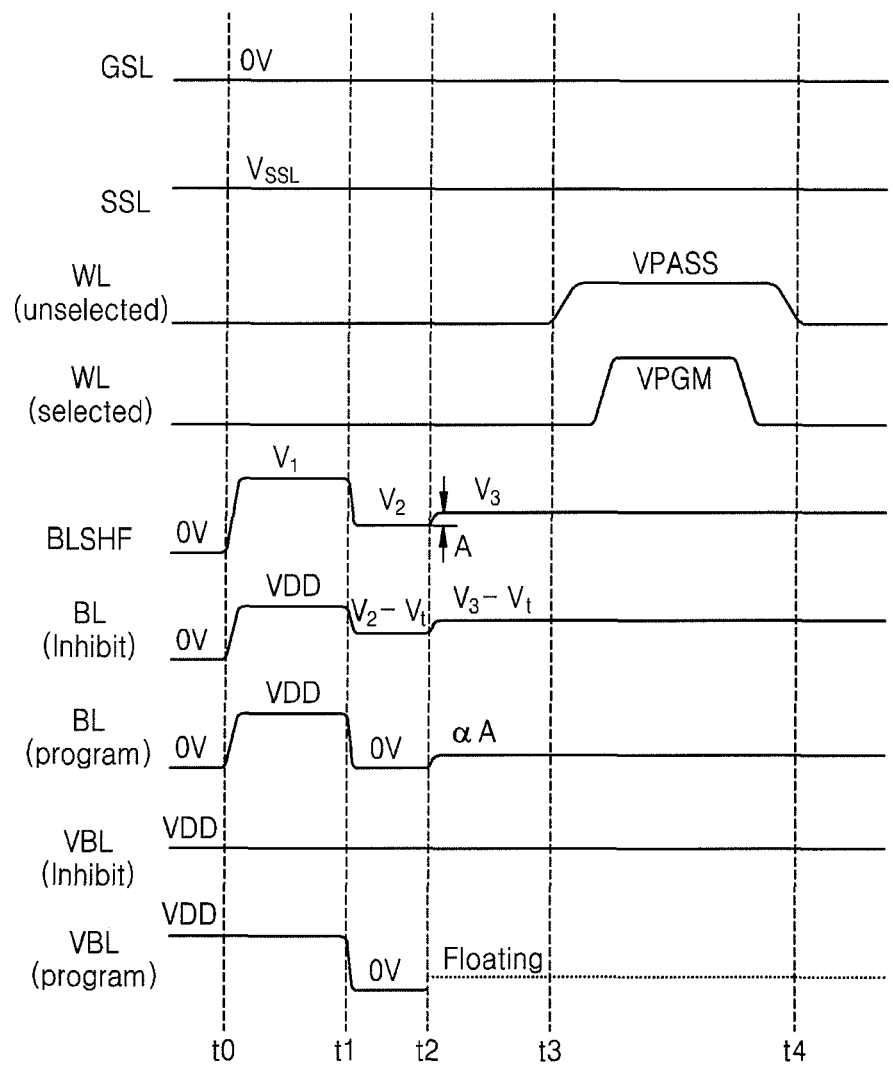
FIG. 4 is a timing diagram showing a bit-line pre-charge operation and a programming operation of a flash memory device, according to an exemplary embodiment of the present inventive concept.

FIG. 4 is a timing diagram illustrating a bit line pre-charge operation and a programming operation in a flash memory device according to an exemplary embodiment of the present inventive concept. FIG. 4 shows waveforms of the GSL, the SSL, an unselected word line (WL(unselected)), a selected word line (WL(selected)), the bit line voltage control signal BLSHF, a bit line in the program inhibited state (BL(inhibit)), a bit line in the programming state (BL(program)), a bit line supplying voltage corresponding to the bit line in the program inhibited state (VBL(inhibit)), and a bit line supplying voltage corresponding to the bit line in the programming state (VBL(program)). Referring to FIG. 4, time intervals t0 to t3 illustrate the pre-charge operation, and time interval t3 to t4 illustrates the programming operation of a memory cell.

In the flash memory device 300 illustrated in FIG. 3 according to the present embodiment, under the assumption that the first bit lines BL0 and BL1 are in the program inhibited state and the second bit lines BL2 and BL3 are in the programming state, the programming operation of the flash memory device 300 will be described with reference to FIG. 4. In FIG. 4, the bit line in the program inhibited state (BL(inhibit)) denotes the first bit line BL1 that is adjacent to the second bit line BL2 that is in the programming state, and the bit line in the programming state (BL(program)) denotes the second bit line BL2 that is adjacent to the first bit line BL1 in the program inhibited state. The GSL and the SSL may be respectively maintained at the voltage levels of 0V and a string selection voltage VSSL during the time intervals t0 to t4, as shown in FIG. 4.

First, in the time interval t0 to t1, the bit line voltage control signal generator 330 may set the voltage level of the bit line voltage control signal BLSHF as a first voltage level V1 and output the bit line voltage control signal BLSHF to the bit line voltage controller 323. In addition, the bit line voltage supplying unit 326 may set the voltage levels of the bit line supplying voltages VBL0 and VBL1 corresponding to the first bit lines BL0 and BL1 in the program inhibited state and the bit line supplying voltages VBL2 and VBL3 corresponding to the second bit lines BL2 and BL3 in the programming state as the power voltage VDD, and output the bit line supplying voltages VBL0, . . . , VBL3.

Here, the first voltage level V1 is higher than the power voltage VDD and unaffected by a change of the power voltage VDD. Then, the transistors TR0, TR1, TR2, and TR3 are all turned on so that the first and second bit lines BL0, BL1, BL2, and BL3 may be pre-charged to the power voltage VDD. For example, the first voltage level V1 may be a page buffer voltage Vpb. However, the first voltage level V1 and the voltage level, to which the first and second bit lines BL0, BL1, BL2, and BL3 are pre-charged, are not limited to the above examples.

Next, at t1, the bit line voltage control signal generator 330 may set the voltage level of the bit line voltage control signal BLSHF as a second voltage level V2, and output the bit line voltage control signal BLSHF to the bit line voltage controller 323. Here, the second voltage level V2 may be lower than the first voltage level V1 and may be unaffected by a change of the power voltage VDD. For example, the second voltage level V2 may be set as 2V.

In addition, at t1, the bit line voltage supplying unit 326 may set and output the bit line supplying voltages VBL2 and VBL3 corresponding to the second bit lines BL2 and BL3 as 0V. When the voltage levels of the bit line supplying voltages VBL2 and VBL3 are reduced to 0V, the second bit lines BL2 and BL3 may be discharged and voltage levels thereof may be reduced to 0V. At this time, when the voltage level of the second bit line BL2 is reduced to 0V, the voltage level of the first bit line BL1 that is adjacent to the second bit line BL2 is also reduced due to the coupling effect. However, since the voltage level of the bit line voltage control signal BLSHF is maintained at the second voltage level V2, voltage level of the first bit line BL1 (BL(inhibit)) may be reduced to the voltage level of V2−Vt.

However, the SST corresponding to the first bit line BL1 may be turned off to maintain the program inhibited state of the first bit line BL1, and thus, the value of V2−Vt is greater than the value of VSSL−Vts (Vt is a threshold voltage of the transistors TR0, TR1, TR2, and TR3 of the bit line voltage controller 323 and Vts is a threshold voltage of the string selection transistors SST0, SST1, SST2, and SST3). If the above condition is satisfied, even when the voltage level of the first bit line BL1 is reduced, the program inhibited state of the first bit line BL1 may be maintained.

On the other hand, the first bit line BL0 that is not adjacent to the second bit line BL2 is not affected by the coupling effect caused by the voltage level reduction of the second bit line BL2, and thus, the voltage level of the first bit line BL0 is maintained at the level of the power voltage VDD.

Next, at t2, the bit line voltage supplying unit 326 may float the bit line supplying voltages VBL2 and VBL3 corresponding to the second bit lines BL2 and BL3. In addition, the bit line voltage control signal generator 330 may set the voltage level of the bit line voltage control signal BLSHF as a third voltage level V3, and output the bit line voltage control signal BLSHF to the bit line voltage controller 323. Here, the third voltage level V3 is greater than the second voltage level V2 by as much as A, and may be unaffected by a change of the power voltage VDD.

When the voltage level of the bit line control signal BLSHF is set as the third voltage level V3 and is greater than the second voltage level V2 by as much as A, the voltage level of the first bit line BL1 (BL(inhibit)) may be increased by as much as A to a voltage of V3−Vt since the bit line supplying voltage VBL1 corresponding to the first bit line BL1 is maintained at the level of the power voltage VDD. In addition, the voltage level of the second bit line BL2 (BL inhibit)) adjacent to the first bit line BL1 is also increased by as much as αA due to the coupling effect caused by the increase of the voltage level (BL(inhibit)) of the first bit line BL1. As described above, α denotes the coupling ratio between the bit lines, and may have a value of about 80% to about 90%.

However, since the second bit line BL2 may be maintained in the programming state, the voltage level of the second bit line (BL(inhibit)), in other words, αA, is smaller than the value of VSSL−Vts in order not to turn off the SST connected to the second bit line BL2. For example, the value of αA may be set as 0.3V.

On the other hand, of the second bit lines BL2 and BL3, the second bit line BL3 that is not adjacent to the first bit line BL1 is not affected by the coupling effect caused by the increase of the voltage level of the first bit line BL1, and thus, the voltage level of the second bit line BL3 is maintained at 0V.

During the time interval t3 to t4, in the flash memory device 300 according to the present embodiment, a programming voltage VPGM is applied to the selected word line (WL (selected)) and a passing voltage VPASS is applied to the unselected word line (WL(unselected)) to perform the programming operation. The programming operation of the flash memory device 300 is known in the art, and thus, detailed descriptions about the programming operation are not provided here.

As described above, in the flash memory device 300 according to the present embodiment, the bit line pre-charging operation may be finished during the time intervals t0 to t3. When the bit line pre-charging operation of t0-t1 is finished, the first bit line BL1 that is in the program inhibited state and adjacent to the second bit line BL2 is pre-charged to a voltage level (V3−Vt) that is lower than the level of the power voltage VDD and is maintained in the program inhibited state. In addition, the second bit line BL2 that is in the programming state and adjacent to the first bit line BL1 may be pre-charged to the voltage level of αA. In addition, the second bit line BL3 that is in the programming state and is not adjacent to the first bit line BL1 may be pre-charged to the voltage level of 0V.

Therefore, during the programming operation (t3-t4) after the bit line pre-charging operation (t0-t3), the memory cell corresponding to the second bit line BL2 that is adjacent to the first bit line BL1 in the program inhibited state is programmed with about αA less voltage than the memory cell corresponding to the second bit line BL3 that is not adjacent to the first bit line BL1. Thus, the memory cell connected to the second bit line BL2 that is adjacent to the first bit line BL1 in the program inhibited state may not be over-programmed to be higher than the ISPP voltage, thereby compensated for over-programming due to the BCE.

During operations of the flash memory device 300 of the present embodiment, the voltage level of the bit line voltage control signal BLSHF output from the bit line voltage control signal generator 330 may be unaffected by a change of the power voltage VDD that is supplied to the flash memory device 300. Therefore, as mentioned above, the flash memory device 300 does not require an additional circuit for generating the voltage VDD+Vt that is applied with the power voltage VDD, and may pre-charge the second bit line BL2 to the constant voltage level αA without being impacted by a change of the power voltage VDD to constantly preclude the over-programming of the ISPP voltage.

One of the ordinary skill in the art may realize the bit line voltage control signal generator 330 and the bit line voltage supplying unit 326 operate according to the timing diagram of FIG. 4 through various other structures than those shown in the figures.

Figure 5:
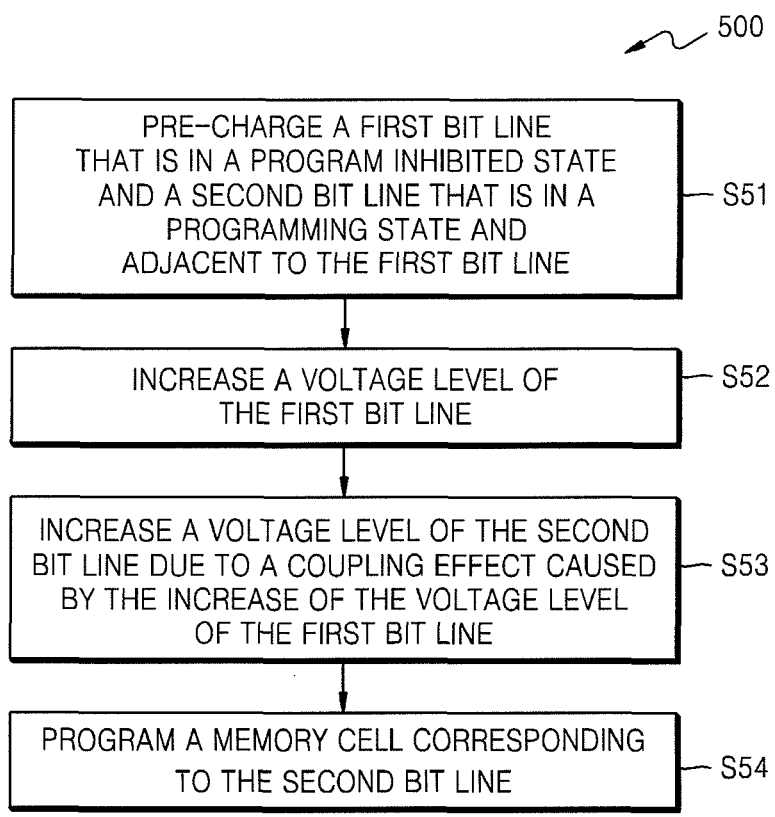
FIG. 5 is a flowchart illustrating a programming method of a flash memory device according to an exemplary embodiment of the present inventive concept.

FIG. 5 is a flowchart illustrating a programming method 500 of a flash memory device according to an exemplary embodiment of the present inventive concept. Referring to FIG. 5, the programming method 500 of a flash memory device may include pre-charging the first bit line that is in the program inhibited state and the second bit line that is in the programming state and adjacent to the first bit line (S51), increasing the voltage level of the first bit line (S52), increasing the voltage level of the second bit line due to the coupling effect caused by the increase of the voltage level of the first bit line (S53), and programming the memory cell corresponding to the second bit line (S54). The details of the programming method of the flash memory device illustrated in FIG. 5 according to the present embodiment have been described above with reference to FIGS. 1 through 4, and thus, no further descriptions of the programming method are provided here.

Figure 6:
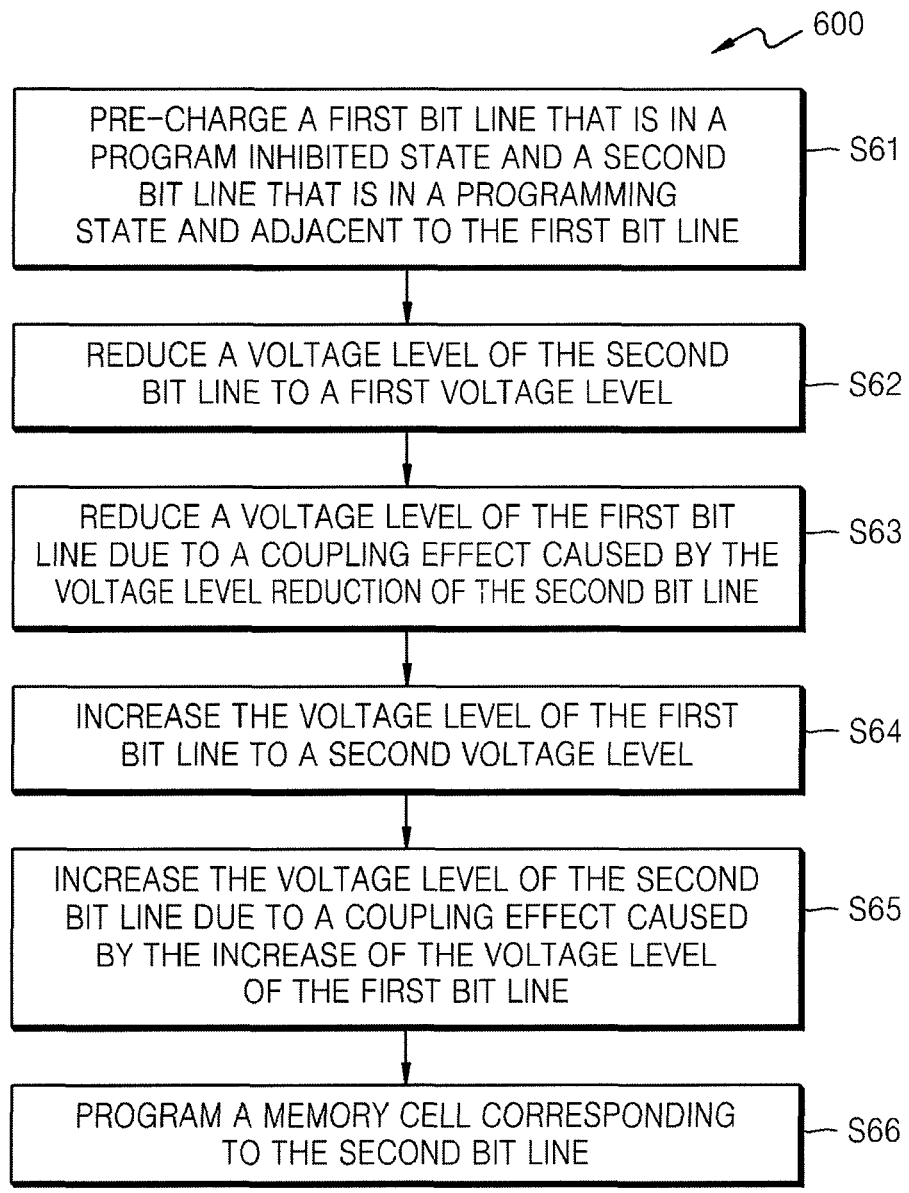
FIG. 6 is a flowchart illustrating a programming method of a flash memory device according to an exemplary embodiment of the present inventive concept.

FIG. 6 is a flowchart illustrating a programming method 600 of a flash memory device according to an exemplary embodiment of the present inventive concept. Referring to FIG. 6, the programming method 600 of a flash memory device of the present embodiment includes pre-charging the first bit line that is in the program inhibited state and the second bit line that is in the programming state and adjacent to the first bit line (S61), reducing the voltage level of the second bit line to a first voltage level, which in this case may be a ground voltage (S62), reducing the voltage level of the first bit line due to the coupling effect caused by the voltage level reduction of the second bit line (S63), increasing the voltage level of the first bit line to a second voltage level, which in this case is greater than the ground voltage and less than the power supply voltage (S64), increasing the voltage level of the second bit line due to the coupling effect caused by the increase of the voltage level of the first bit line (S65), and programming the memory cell corresponding to the second bit line (S66). The details of the programming method 600 of a flash memory device illustrated in FIG. 6 according to the present embodiment have been described with reference to FIGS. 1 through 4, and thus, no further descriptions of the programming method are provided here.

Figure 7:
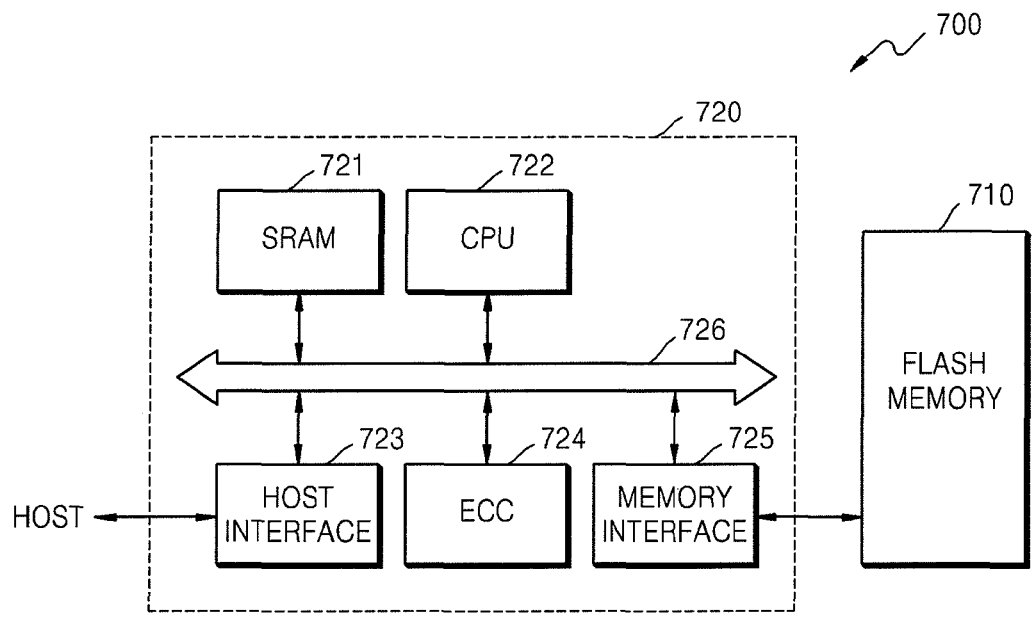
FIG. 7 is a block diagram showing a memory card including a flash memory device according to an exemplary embodiment of the present inventive concept.

FIG. 7 is a diagram showing a memory card 700 including a flash memory device 710 according to an exemplary embodiment of the present inventive concept. As shown in FIG. 7, the flash memory device 710 and a memory controller 720 may constitute the memory card 700. In this case, the memory controller 720 may be configured to communicate with an external device (for example, a host) according to one of various interfaces such as a universal serial bus (USB) interface, a multimedia card (MMC) interface, a peripheral component interconnect express (PCIe) interface, a serial advanced technology attachment (SATA) interface, a parallel advanced technology attachment (PATA) interface, a small computer system interface (SCSI), an enhanced small device interface (ESDI), and an integrated drive electronics (IDE) interface. Structures and operations of a static random access memory (SRAM) 721, a central processing unit (CPU) 722, a host interface 723, an error correction code (ECC) 724, a memory interface 725, and a bus 726 included in the memory controller 720 of FIG. 7 are known in the art, and thus, detailed descriptions thereof are not provided here.

The memory controller 720 and the flash memory device 710 may form a solid state drive/disk (SSD) that uses a non-volatile memory to store data.

Figure 8:
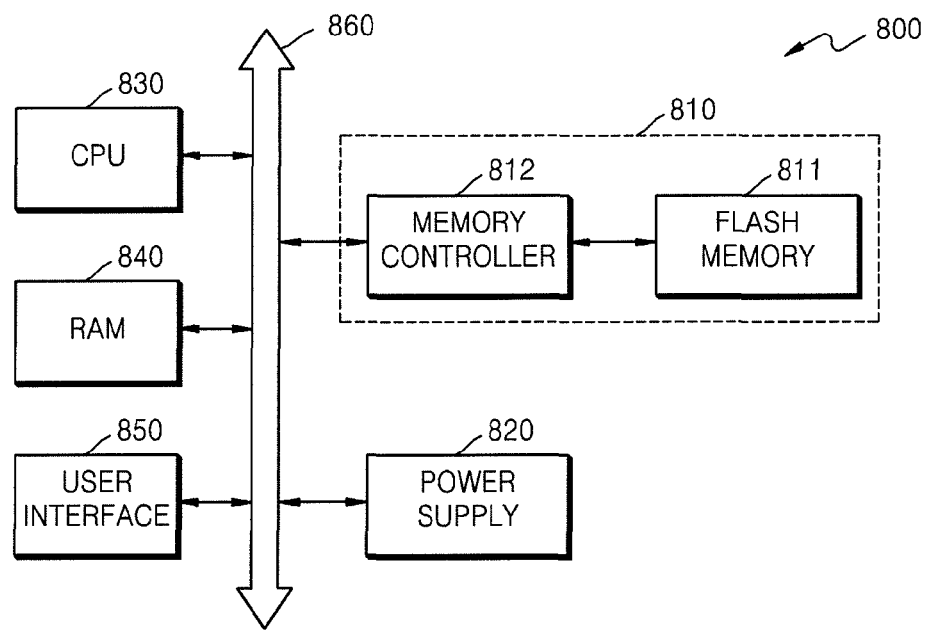
FIG. 8 is a block diagram showing a computing system including a flash memory device according to an exemplary embodiment of the present inventive concept.

FIG. 8 is a diagram showing a computing system 800 including a flash memory device 811 according to an exemplary embodiment of the present inventive concept. Referring to FIG. 8, the computing system 800 includes a CPU 830 electrically connected to a bus 860, a user interface 850, and a flash memory system 810 including a memory controller 812 and the flash memory device 811. The computing system 800 of the present embodiment may further include a RAM 840 and a power supply device 820.

The flash memory system 810 shown in FIG. 8 may correspond to the memory card 700 of FIG. 7. The flash memory device 811 may store N-bit data (where N is an integer of 1 or greater) that is processed/will be processed by the CPU 830 through the memory controller 812.

If the computing system 800 of the present embodiment is a mobile device, a battery for supplying an operating voltage of the computing system 800 and a modem such as a baseband chipset may be additionally provided in the computing system 800. In addition, it is known in the art that the computing system 800 may further include an application chipset, a camera image processor, and a mobile DRAM, and thus, detailed descriptions thereof are not provided here.

The flash memory device according to the exemplary embodiments of the present inventive concept may be package in various types of packages. For example, the flash memory device may be packaged by using packages such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip-On-Board (COB), Ceramic Dual In-Line Package (CERDIP), Metric Quad Flat Pack (MQFP), Thin Quad Flat Pack (TQFP), Small-Outline Integrated circuit (SOIC) package, Shrink Small-Outline Package (S SOP), Thin Small-Outline Package (TSOP), System In Package (SIP), Multi-Chip Package (MCP), Wafer-level Fabricated Package (WFP), and Wafer-Level Processed Stack Package (WSP).

While the inventive concept has been particularly shown and described with reference to exemplary embodiments thereof, it will be understood by those of ordinary skill in the art that various changes in form and details may be made therein without departing from the spirit and scope of the inventive concept defined by the following claims.

What is claimed is:

1. A flash memory device, comprising:
    a memory cell array comprising a plurality of memory cells;
    a bit line voltage control signal generator generating and outputting a bit line voltage control signal; and
    a page buffer unit connected to the memory cell array through a plurality of bit lines, and controlling voltage levels of the plurality of bit lines in response to the bit line voltage control signal output from the bit line voltage control signal generator,
    wherein the plurality of bit lines comprise a first bit line and a second bit line adjacent to the first bit line, wherein during a bit line pre-charging operation in which the first bit line is in a program inhibited state and the second bit line is in a programming state, the page buffer unit increases a voltage level of the first bit line in response to the bit line voltage control signal, wherein the increase in the voltage level of the first bit line causes a voltage level of the second bit line to increase, and wherein a voltage level of the bit line voltage control signal is not affected by a change in a power voltage of the flash memory device.

2. The flash memory device of claim 1, wherein the page buffer unit comprises:
    a bit line voltage supplying unit outputting a plurality of bit line supplying voltages respectively corresponding to the plurality of bit lines; and
    a bit line voltage controller controlling the voltage levels of the plurality of bit lines in response to the bit line voltage control signal and the plurality of bit line supplying voltages.

3. The flash memory device of claim 2, wherein the bit line voltage controller comprises a plurality of transistors connected between the plurality of bit lines and the bit line voltage supplying unit, wherein first terminals of the plurality of transistors are connected to corresponding bit lines, second terminals of the plurality of transistors are supplied with corresponding bit line supplying voltages, and the bit line voltage control signal is applied to gate terminals of the plurality of transistors.

4. The flash memory device of claim 2, wherein the voltage level of the bit line voltage control signal is transited to a first voltage level, a second voltage level, and a third voltage level in the bit line pre-charging operation before a programming operation of the flash memory device.

5. The flash memory device of claim 4, wherein the first voltage level is greater than a level of the power voltage, and the first bit line and the second bit line are pre-charged to the level of the power voltage while the voltage level of the bit line voltage control signal is maintained at the first voltage level.

6. The flash memory device of claim 4, wherein the second voltage level is lower than the first voltage level, and the first bit line is maintained in the program inhibited state and the second bit line is discharged to a ground voltage while the voltage level of the bit line voltage control signal is maintained at the second voltage level.

7. The flash memory device of claim 6, wherein the voltage level of the first bit line is reduced due to the second bit line being discharged to the ground voltage, while the voltage level of the bit line voltage control signal is maintained at the second voltage level.

8. The flash memory device of claim 4, wherein the third voltage level is greater than the second voltage level, and the bit line supplying voltage corresponding to the second bit line is floated before the voltage level of the bit line voltage control signal is transited from the second voltage level to the third voltage level.

9. The flash memory device of claim 8, wherein the voltage level of the second bit line is increased due to the voltage level of the first bit line being increased, when the voltage level of the bit line voltage control signal is transited from the second voltage level to the third voltage level.

10. The flash memory device of claim 4, wherein the first voltage level, the second voltage level, and the third voltage level have constant voltage levels that are not affected by the change of the power voltage.

11. A flash memory device, comprising:
    a memory cell array comprising a plurality of memory cells; and
    a page buffer unit connected to the memory cell array through a plurality of bit lines, and controlling voltage levels of the plurality of bit lines in response to a bit line voltage control signal,
    wherein the plurality of bit lines comprise a first bit line and a second bit line adjacent to the first bit line, wherein during a bit line pre-charging operation in which the first bit line is in a program inhibited state and the second bit line is in a programming state, the page buffer unit increases a voltage level of the first bit line in response to the bit line voltage control signal, wherein the increase in the voltage level of the first bit line causes a voltage level of the second bit line to increase, and wherein a voltage level of the bit line voltage control signal is not affected by a change in a power voltage of the flash memory device.

12. The flash memory device of claim 11, wherein the page buffer unit comprises:
    a bit line voltage supplying unit outputting a plurality of bit line supplying voltages respectively corresponding to the plurality of bit lines; and a bit line voltage controller controlling the voltage levels of the plurality of bit lines in response to the bit line voltage control signal and the plurality of bit line supplying voltages.

13. The flash memory device of claim 12, wherein the voltage level of the bit line voltage control signal is transited to a first voltage level, a second voltage level, and a third voltage level in the bit line pre-charging operation before a programming operation of the flash memory device.

14. The flash memory device of claim 13, wherein the first voltage level is greater than a level of the power voltage, and the first bit line and the second bit line are pre-charged to the level of the power voltage while the voltage level of the bit line voltage control signal is maintained at the first voltage level.

15. The flash memory device of claim 13, wherein the second voltage level is lower than the first voltage level, and the first bit line is maintained in the program inhibited state and the second bit line is discharged to a ground voltage while the voltage level of the bit line voltage control signal is maintained at the second voltage level.

16. The flash memory device of claim 13, wherein the third voltage level is greater than the second voltage level, and the bit line supplying voltage corresponding to the second bit line is floated before the voltage level of the bit line voltage control signal is transited from the second voltage level to the third voltage level.

17. A method of programming a flash memory device, the method comprising:
pre-charging a first bit line that is in a program inhibited state and a second bit line that is in a programming state and adjacent to the first bit line;
reducing a voltage level of the second bit line to a first voltage;
increasing a voltage level of the first bit line to a second voltage after reducing the voltage level of the second bit line to the first voltage, and increasing the voltage level of the second bit line due to the increase of the voltage level of the first bit line to the second voltage; and
programming a memory cell corresponding to the second bit line,
wherein the second voltage is not affected by a change in a power voltage of the flash memory device.

18. The method of claim 17, wherein when the voltage level of the second bit line is reduced to the first voltage, this causes the voltage level of the first bit line to be reduced.

19. The method of claim 18, wherein the voltage level of the first bit line, which is reduced when the voltage level of the second bit line is reduced to the first voltage, is not affected by the change in the power voltage and maintains the first bit line in the program inhibited state.

20. The method of claim 17, wherein a bit line supplying voltage corresponding to the second bit line is floated before increasing the voltage level of the first bit line to the second voltage.

21. A non-volatile memory device, comprising: a unit connected to a plurality of memory cells via a plurality of bit lines, wherein the unit controls voltage levels of the plurality of bit lines in response to a first signal,
wherein the plurality of bit lines comprise a first bit line and a second bit line adjacent to the first bit line, and when the first bit line is in a program inhibited state and the second bit line is in a programming state, the unit increases a voltage of the first bit line by a first amount in response to the first signal, wherein the increase of the voltage of the first bit line by the first amount causes a voltage of the second bit line to be increased by a second amount, and
wherein a power voltage of the non-volatile memory device transitions from a first level to a second level, the first amount does not change.

22. The non-volatile memory device of claim 21, wherein a memory cell connected to the second bit line is programmed with a programming voltage reduced by about the second amount.

* * * * *